(12) United States Patent
Chuang

(10) Patent No.: US 7,382,164 B1
(45) Date of Patent: Jun. 3, 2008

(54) GLITCH SUPPRESSING APPARATUS

(75) Inventor: Chao-Kuei Chuang, Hsinchu (TW)

(73) Assignee: Wisepal Technologies, Inc., Miao-Li County (TW)

( * ) Notice: Subject to any disclaimer, the term of this patent is extended or adjusted under 35 U.S.C. 154(b) by 37 days.

(21) Appl. No.: 11/613,864

(22) Filed: Dec. 20, 2006

(30) Foreign Application Priority Data

Sep. 29, 2006  (TW) ............................. 95136202 A

(51) Int. Cl.
  *G06F 1/08* (2006.01)
(52) U.S. Cl. ......................................... 327/34; 327/551
(58) Field of Classification Search ............... 327/34, 327/97, 99, 165, 292, 310, 551
  See application file for complete search history.

(56) References Cited

U.S. PATENT DOCUMENTS

| | | | | |
|---|---|---|---|---|
| 5,003,513 A | * | 3/1991 | Porter et al. ........... 365/230.08 |
| 5,438,550 A | * | 8/1995 | Kim ......................... 365/233.5 |
| 5,448,529 A | * | 9/1995 | Reddy et al. ............. 365/233.5 |
| 5,696,463 A | * | 12/1997 | Kwon ......................... 327/172 |
| 5,886,562 A | * | 3/1999 | Garrity et al. .............. 327/415 |
| 7,224,212 B2 | * | 5/2007 | Tseng .......................... 327/551 |
| 2004/0095165 A1 | * | 5/2004 | Itoh ............................. 327/99 |

* cited by examiner

*Primary Examiner*—N. Drew Richards
*Assistant Examiner*—Thomas J Hiltunen
(74) *Attorney, Agent, or Firm*—J.C. Patents

(57) ABSTRACT

A glitch suppressing apparatus is provided. The glitch suppressing apparatus comprises four N-type transistors, four P-type transistors, a first delay circuit, a second delay circuit, a first logic circuit, a second logic circuit and two inverters. The glitch suppressing apparatus uses the specific connection relations and functions of the above components to filter positive glitches and negative glitches in the same circuit, so that the glitch suppressing apparatus can be implemented on a smaller chip area.

22 Claims, 18 Drawing Sheets

US 7,382,164 B1

GLITCH SUPPRESSING APPARATUS

CROSS-REFERENCE TO RELATED APPLICATION

This application claims the priority benefit of Taiwan application serial no. 95136202, filed on Sep. 29, 2006. All disclosure of the Taiwan application is incorporated herein by reference.

BACKGROUND OF THE INVENTION

1. Field of the Invention

The present invention relates to a glitch suppressing apparatus, and more particularly, to a glitch suppressing apparatus for filtering positive glitches and negative glitches through a single circuit.

2. Description of Related Art

Conventional glitch suppressing methods mainly focus on suppressing positive glitches or negative glitches. FIG. 1 is a circuit diagram of a conventional positive glitch suppressing circuit. Referring to FIG. 1, the positive glitch suppressing circuit includes inverters 101, 103, and 107, delay circuits 102 and 105, and logic circuits 104 and 106, wherein the delay circuit 102 is used to delay an input signal S for a time t1, the delay circuit 105 is used to delay the positive edge of an output signal T of the logic circuit 104 for a time t2, and the logic circuits 104 and 106 are achieved by an OR gate and an AND gate respectively. Provided that the input signal S has a positive glitch with a width W, the timings of each of the signals in the positive glitch suppressing circuit are shown in FIGS. 2 and 3.

FIG. 2 shows the timings of each of the signals when the delay time t1 of the circuit shown in FIG. 1 is larger than the width W of the glitch. FIG. 3 shows the timings of each of the signals when the delay time t1 of the circuit shown in FIG. 1 is smaller than or equal to the width W of the glitch. As can be seen from FIG. 2 and FIG. 3, when the delay time t1 is larger than the width W of the glitch, the positive glitch suppressing circuit filters the positive glitches in the input signal S, as a result, an output signal V without any positive glitches is obtained. However, under the circumstance that the delay time t1 is smaller than or equal to the width W of the glitch, the positive glitch suppressing circuit cannot efficiently filter the positive glitches in the input signal S, as a result, the output signal V still has positive glitch noises.

FIG. 4 is a circuit diagram of a conventional negative glitch suppressing circuit. Referring to FIG. 4, the negative glitch suppressing circuit includes inverters 401, 403, and 407, delay circuits 402 and 405, logic circuits 404 and 406, wherein the delay circuit 402 is used to delay the input signal S for a time t2, the delay circuit 405 is used to delay the negative edge of an output signal U of the logic circuit 404 for a time t1, and the logic circuits 404 and 406 are achieved by an AND gate and an OR gate respectively. Provided that the input signal S has a negative glitch with a width W, the timings of each of the signals in the negative glitch suppressing circuit are shown in FIGS. 5 and 6.

FIG. 5 shows the timings of each of the signals when the delay time t2 of the circuit shown in FIG. 4 is larger than the width W of the glitch. FIG. 6 shows the timings of each of the signals when the delay time t2 of the circuit shown in FIG. 4 is smaller than or equal to the width W of the glitch. As can be seen from FIG. 5 and FIG. 6, when the delay time t2 is larger than the width W of the glitch, the negative glitch suppressing circuit filters the negative glitches in the input signal S, as a result, an output signal V without any negative glitches is obtained. However, under the circumstance that the delay time t2 is smaller than or equal to the width W of the glitch, the negative glitch suppressing circuit cannot efficiently filter the negative glitches in the input signal S, as a result, the output signal V still has negative glitch noises.

The aforementioned glitch suppressing circuits both have their limits in filtering noises, but such circumstances can be improved by adjusting the delay time. Generally, in order to suppress both the positive glitches and the negative glitches when both of them exist, the positive glitch suppressing circuit and the negative glitch suppressing circuit are successively connected in series, so as to filter the positive glitches and the negative glitches in the signal, as shown in FIG. 7.

FIG. 7 shows a conventional glitch suppressing apparatus. Referring to FIG. 7, the glitch suppressing apparatus includes a positive glitch suppressing circuit 710 and a negative glitch suppressing circuit 720. The positive glitch suppressing circuit 710 is identical to the circuit shown in FIG. 1, and the negative glitch suppressing circuit 720 is identical to the circuit shown in FIG. 4. The positive glitch suppressing circuit 710 receives an input signal IN, filters the positive glitches in the input signal IN, and then outputs the input signal IN into the negative glitch suppressing circuit 720 to filter the negative glitches in the input signal IN, and finally, an output signal OUT free of glitches is output.

However, such method of integrating the two mechanisms requires two circuits, one for suppressing positive glitches, and the other for suppressing negative glitches. Therefore, if such glitch suppressing apparatus is adopted in a chip, a large area on the chip is required.

SUMMARY OF THE INVENTION

The present invention is directed to a glitch suppressing apparatus that occupy comparatively smaller chip area.

Based upon the aforementioned and other objects, the present invention provides a glitch suppressing apparatus, which comprises a first switch, a second switch, a first delay circuit, a first logic circuit, a first inverter, a third switch, a fourth switch, a second delay circuit, a second logic circuit, and a second inverter.

The first switch receives a first input signal and a second input signal and accordingly determines whether or not to output the second input signal, wherein the second input signal is an inverted signal of the first input signal. The second switch receives a first input signal, a second input signal, and a first logic signal, and accordingly determines whether or not to output the first logic signal according to the first input signal and the second input signal, wherein the outputs of the first switch and the second switch form a first signal, which is one of the second input signal and the first logic signal. The first delay circuit receives the first signal and delays the negative edge of the first signal to generate a first delay signal. The first logic circuit receives the first signal and the first delay signal to generate a second logic signal. The first inverter receives and inverts the second logic signal to generate a first output signal.

The third switch receives the first input signal, the second input signal, and the second logic signal, and determines whether or not to output the second logic signal according to the first input signal and the second input signal. The fourth switch receives the first input signal and the second input signal, and accordingly determines whether or not to output the second input signal, wherein the outputs of the third switch and the fourth switch form a second signal, which is one of the second input signal and the second logic signal. The second delay circuit receives the second signal and delays the positive edge of the second signal to generate a second delay signal. The second logic circuit receives the second signal and the second delay signal to generate the first logic signal. The second inverter receives and inverts the first logic signal to generate a second output signal.

In the glitch suppressing apparatus according to an embodiment of the present invention, the first switch comprises a first transistor and a second transistor. The gate of the first transistor receives the first input signal, and one source/drain of the first transistor receives the second input signal. The gate and a source/drain of the second transistor receive the second input signal, and another source/drain of the second transistor is coupled to another source/drain of the first transistor, the first logic circuit and the first delay circuit.

The second switch comprises a third transistor and a fourth transistor. A gate of the third transistor receives the second input signal, and one source/drain of the third transistor receives the first logic signal. A gate of the fourth transistor receives the first input signal, a source/drain of the fourth transistor receives the first logic signal, and another source/drain of the fourth transistor is coupled to another source/drain of the third transistor and another source/drain of the second transistor to generate the first signal.

The third switch comprises a fifth transistor and a sixth transistor. A gate of the fifth transistor receives the first input signal, and a source/drain of the fifth transistor receives the second logic signal. A gate of the sixth transistor receives the second input signal, a source/drain of the sixth transistor receives the second logic signal, and another source/drain of the sixth transistor is coupled to another source/drain of the fifth transistor, the second logic circuit and the second delay circuit.

The fourth switch comprises a seventh transistor and an eighth transistor. A gate and one source/drain of the seventh transistor receive the second input signal. A gate of the eighth transistor receives the first input signal, a source/drain of the eighth transistor receives the second input signal, and another source/drain of the eighth transistor is coupled to another source/drain of the seventh transistor and another source/drain of the sixth transistor to generate the second signal.

In the aforementioned embodiment, the first transistor, the third transistor, the fifth transistor, and the seventh transistor are N-type metal oxide semiconductor field effect transistors, and the second transistor, the fourth transistor, the sixth transistor, and the eighth transistor are P-type metal oxide semiconductor field effect transistors.

The first logic circuit comprises an OR gate, and two input terminals of the OR gate receive the first signal and the first delay signal respectively to generate the second logic signal. The second logic circuit comprises an AND gate, and two input terminals of the AND gate receive the second signal and the second delay signal respectively to generate the first logic signal.

According to another embodiment of the present invention, the first logic circuit comprises a third inverter, a fourth inverter, and a NAND gate. The third inverter is used to receive and invert the first signal. The fourth inverter is used to receive and invert the first delay signal. The two input terminals of the NAND gate receive the outputs of the third inverter and the fourth inverter respectively to generate the second logic signal. The second logic circuit comprises a fifth inverter, a sixth inverter, and a NOR gate. The fifth inverter is used to receive and invert the second signal. The sixth inverter is used to receive and invert the second delay signal. The two input terminals of the NOR gate receive the outputs of the fifth inverter and the six inverter respectively to generate the first logic signal.

In accordance with the aforementioned and other objects of the present invention, a glitch suppressing apparatus is provided, which comprises a first switch, a second switch, a first inverter, a first delay circuit, a first logic circuit, a second inverter, a third switch, a fourth switch, a third inverter, a second delay circuit, a second logic circuit and a fourth inverter.

The first switch receives the first input signal and the second input signal, and accordingly determines whether or not to output the second input signal, wherein the second input signal is an inverted signal of the first input signal. The second switch receives the first input signal, the second input signal and the first logic signal, and determines whether or not to output the first logic signal according to the first input signal and the second input signal, wherein the outputs of the first switch and the second switch form the first signal. The input terminal of the first inverter receives the first signal to generate an inverted signal of the first signal. The first delay circuit receives the inverted signal of the first signal and delays the positive edge of the inverted signal of the first signal to generate the first delay signal. The first logic circuit receives the inverted signal of the first signal and the first delay signal to generate the second logic signal. The second inverter receives and inverts the second logic signal to generate the first output signal.

The third switch receives the first input signal, the second input signal and the second logic signal, and determines whether or not to output the second logic signal according to the first input signal and the second input signal. The fourth switch receives the first input signal and the second input signal, and accordingly determines whether or not to output the second input signal, wherein the outputs of the third switch and the fourth switch form the second signal. The input terminal of the third inverter receives the second signal to generate an inverted signal of the second signal. The second delay circuit receives the inverted signal of the second signal and delays the negative edge of the inverted signal of the second signal to generate the second delay signal. The second logic circuit receives the inverted signal of the second signal and the second delay signal to generate the first logic signal. The fourth inverter receives and inverts the first logic signal to generate the second output signal.

According to an embodiment of the present invention, the first switch comprises a first transistor and a second transistor. A gate of the first transistor receives the first input signal, and a source/drain of the first transistor receives the second input signal. A gate and a source/drain of the second transistor receive the second input signal, and another source/drain of the second transistor is coupled to another source/drain of the first transistor and the input terminal of the first inverter.

The second switch comprises a third transistor and a fourth transistor. A gate of the third transistor receives the second input signal, and a source/drain of the third transistor receives the first logic signal. A gate of the fourth transistor receives the first input signal, a source/drain of the fourth transistor receives the first logic signal, and another source/drain of the fourth transistor is coupled to another source/drain of the third transistor and another source/drain of the second transistor to generate the first signal.

The third switch comprises a fifth transistor and a sixth transistor. A gate of the fifth transistor receives the first input signal, and a source/drain of the fifth transistor receives the second logic signal. A gate of the sixth transistor receives the second input signal, a source/drain of the sixth transistor receives the second logic signal, and another source/drain of the sixth transistor is coupled to another source/drain of the fifth transistor and the input terminal of the third inverter.

The fourth switch comprises a seventh transistor and an eighth transistor. A gate and a source/drain of the seventh transistor receive the second input signal. A gate of the eighth transistor receives the first input signal, a source/drain of the eighth transistor receives the second input signal, and another source/drain of the eighth transistor is coupled to another source/drain of the seventh transistor and another source/drain of the sixth transistor to generate the second signal.

In the aforementioned embodiments, the first transistor, the third transistor, the fifth transistor and the seventh transistor are N-type metal oxide semiconductor field effect transistors and the second transistor, the fourth transistor, the sixth transistor and the eighth transistor are P-type metal oxide semiconductor field effect transistors.

The first logic circuit comprises a NAND gate. Two input terminals of the NAND gate receive the inverted signal of the first signal and the first delay signal respectively to generate the second logic signal. The second logic circuit comprises a NOR gate. Two input terminals of the NOR gate receive the inverted signal of the second signal and the second delay signal respectively to generate the first logic signal.

The glitch suppressing apparatus of the present invention comprises four N-type transistors, four P-type transistors, the first delay circuit, the second delay circuit, the first logic circuit, the second logic circuit and two inverters, so that the glitch suppressing apparatus uses the specific connection relations and functions of the above components to filter positive glitches and negative glitches in the same circuit, thereby reducing the occupied chip area and enhancing the competitiveness of products.

In order to make the aforementioned and other objects, features and advantages of the present invention comprehensible, preferred embodiments accompanied with figures are described in detail below.

It is to be understood that both the foregoing general description and the following detailed description are exemplary, and are intended to provide further explanation of the invention as claimed.

DESCRIPTION OF EMBODIMENTS

Figure 1:
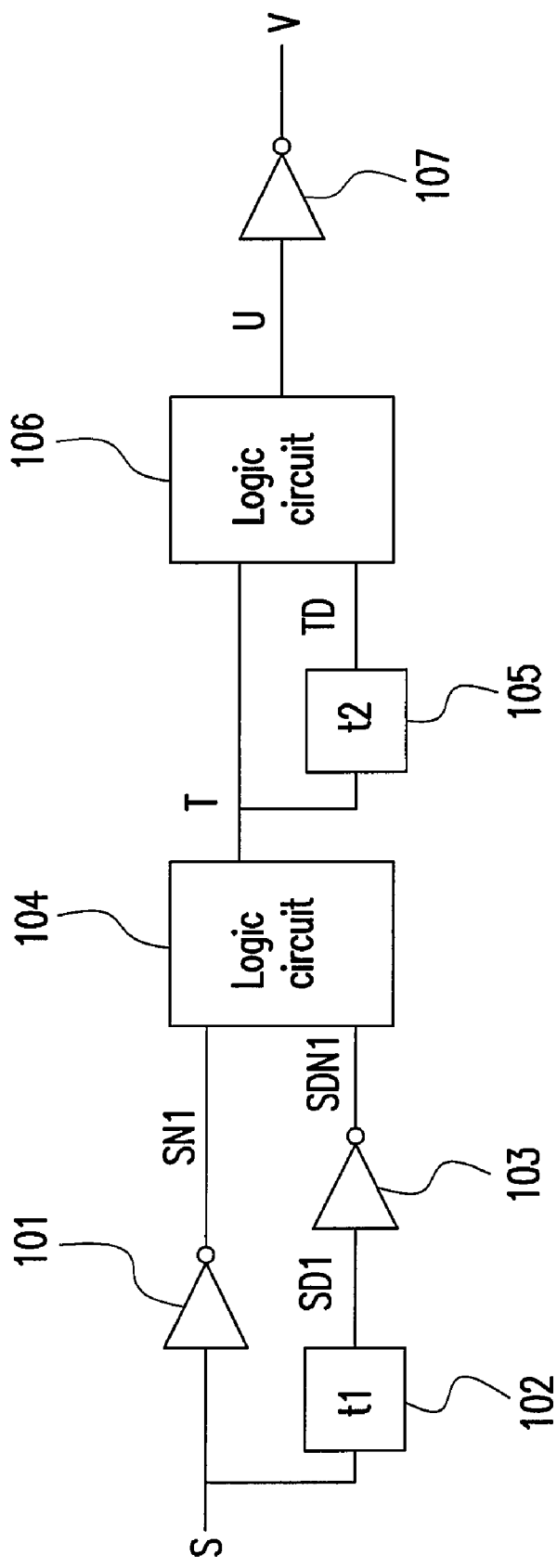
FIG. 1 is a circuit diagram of a conventional positive glitch suppressing circuit.
Figure 2:
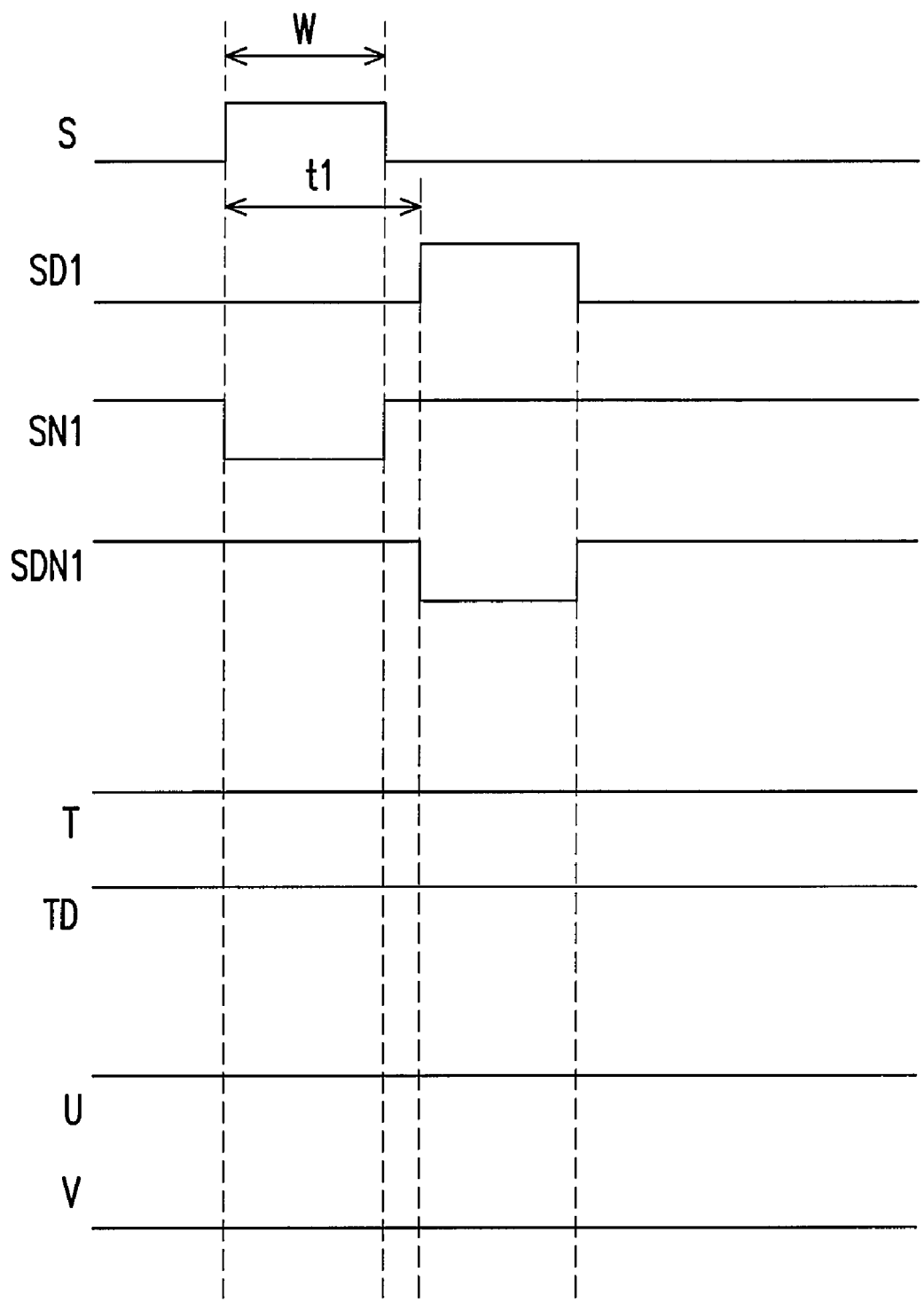
FIG. 2 shows the timings of each of the signals when the delay time t1 of the circuit shown in FIG. 1 is larger than the width W of the glitch.
Figure 3:
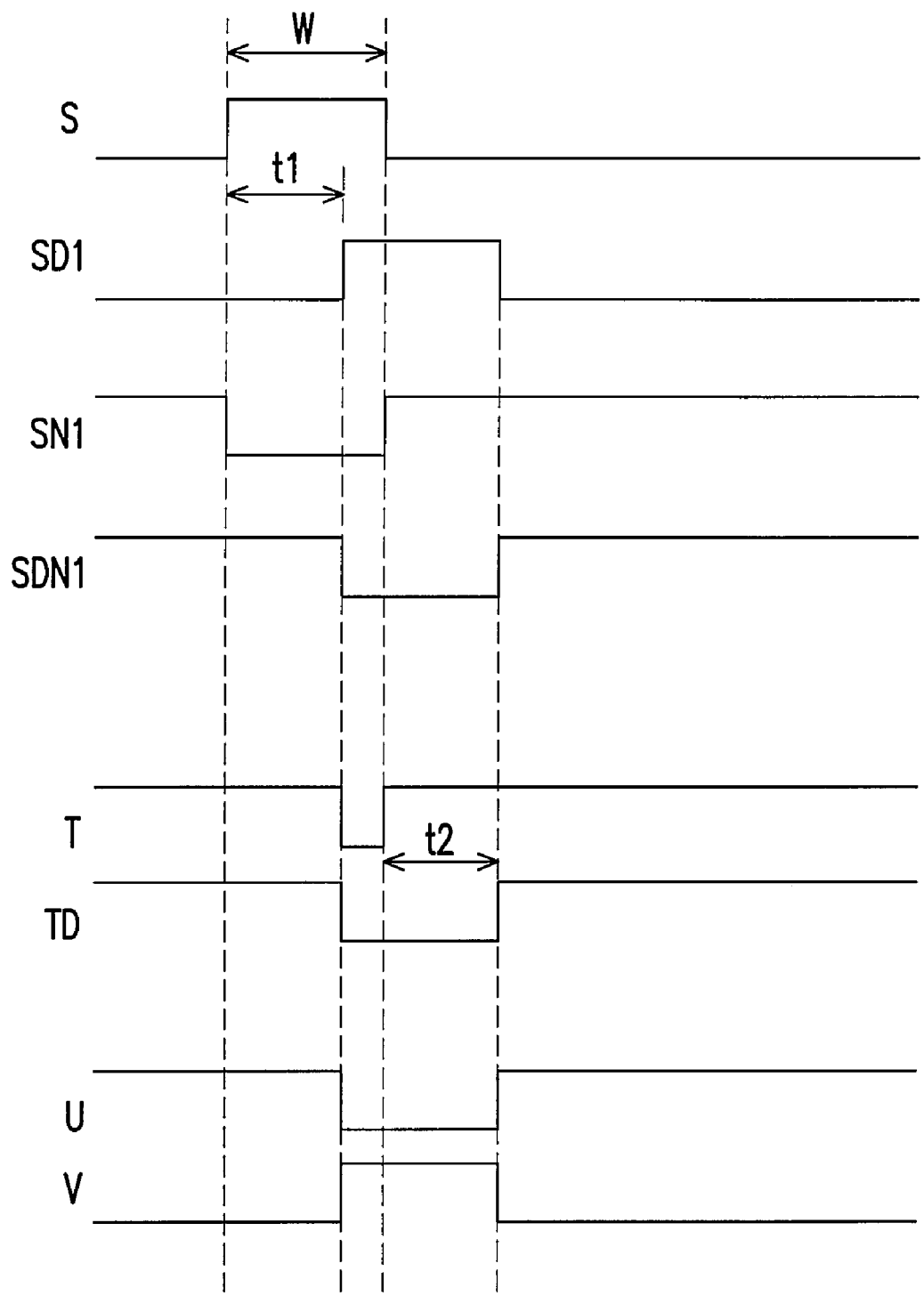
FIG. 3 shows the timings of each of the signals when the delay time t1 of the circuit shown in FIG. 1 is smaller than or equal to the width W of the glitch.
Figure 4:
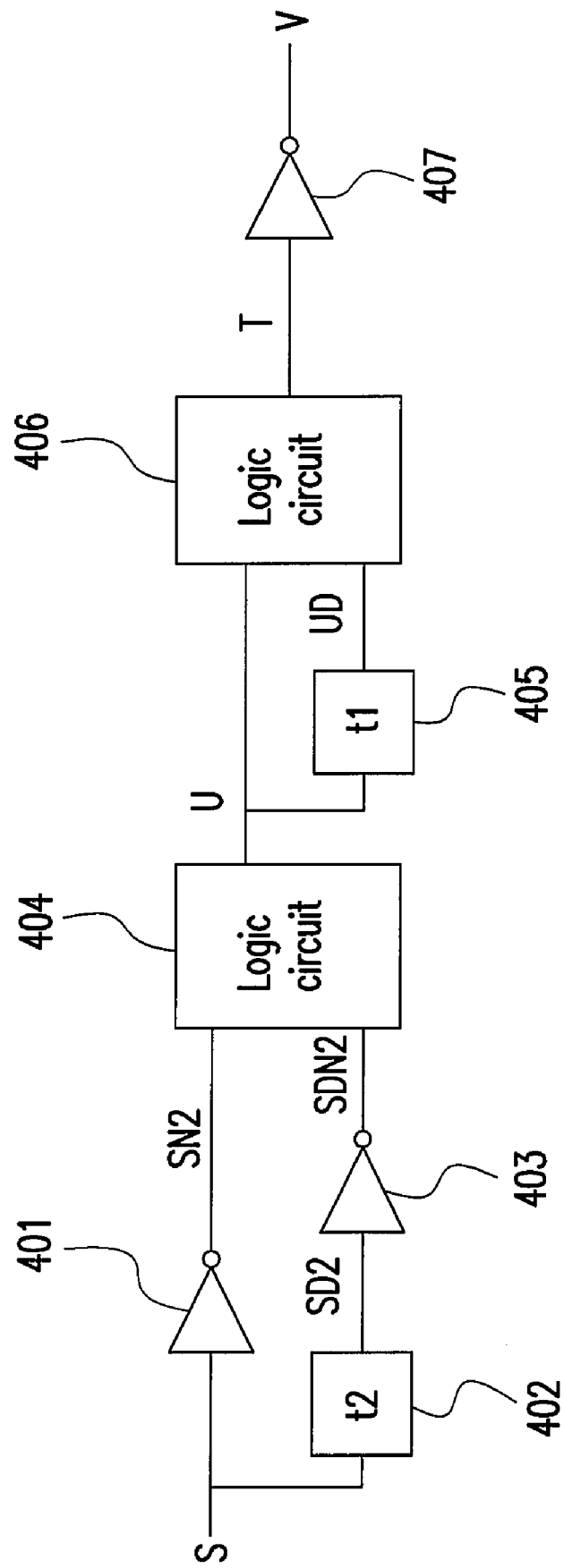
FIG. 4 is a circuit diagram of a conventional negative glitch suppressing circuit.
Figure 5:
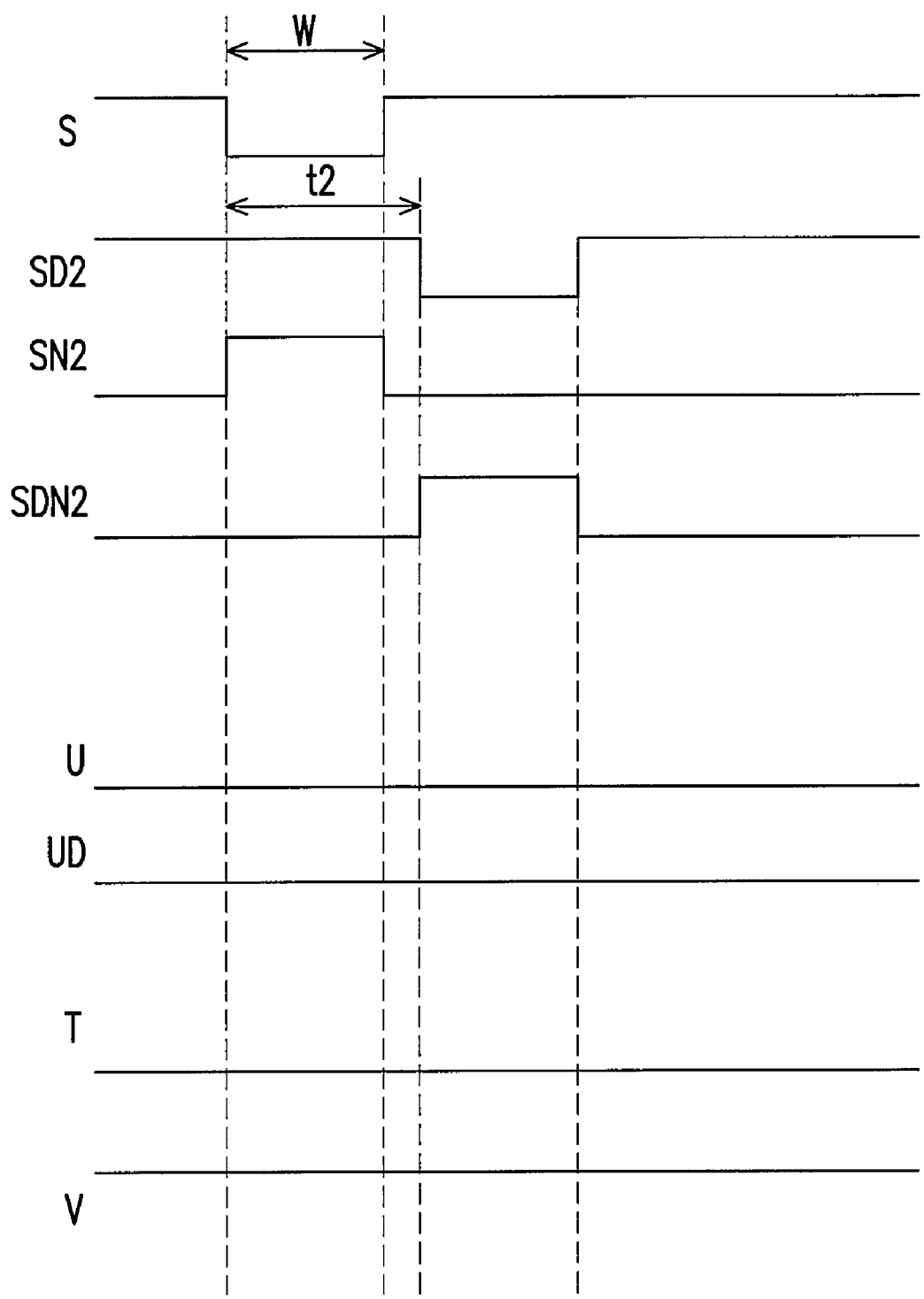
FIG. 5 shows the timings of each of the signals when the delay time t2 of the circuit shown in FIG. 4 is larger than the width W of the glitch.
Figure 6:
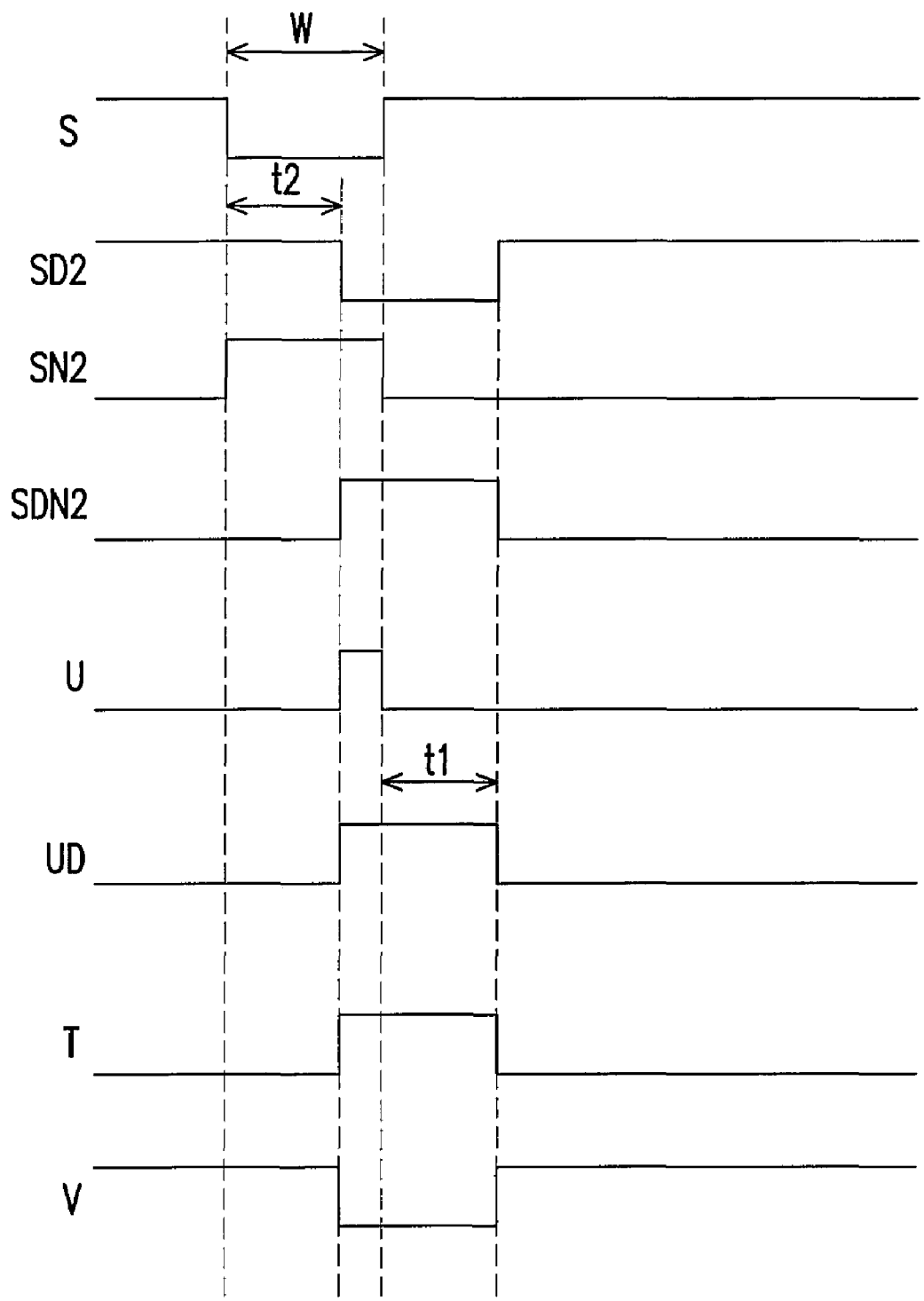
FIG. 6 shows the timings of each of the signals when the delay time t2 of the circuit shown in FIG. 4 is smaller than or equal to the width W of the glitch.
Figure 7:
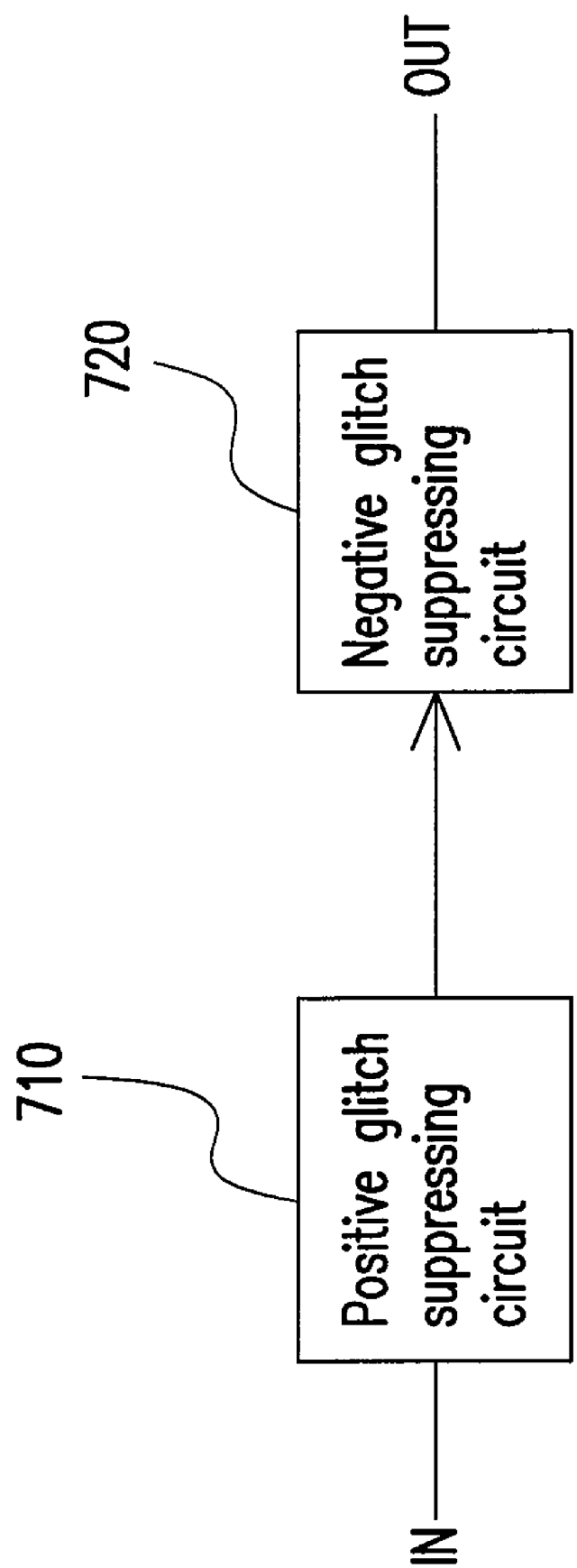
FIG. 7 shows a conventional glitch suppressing apparatus.
Figure 8:
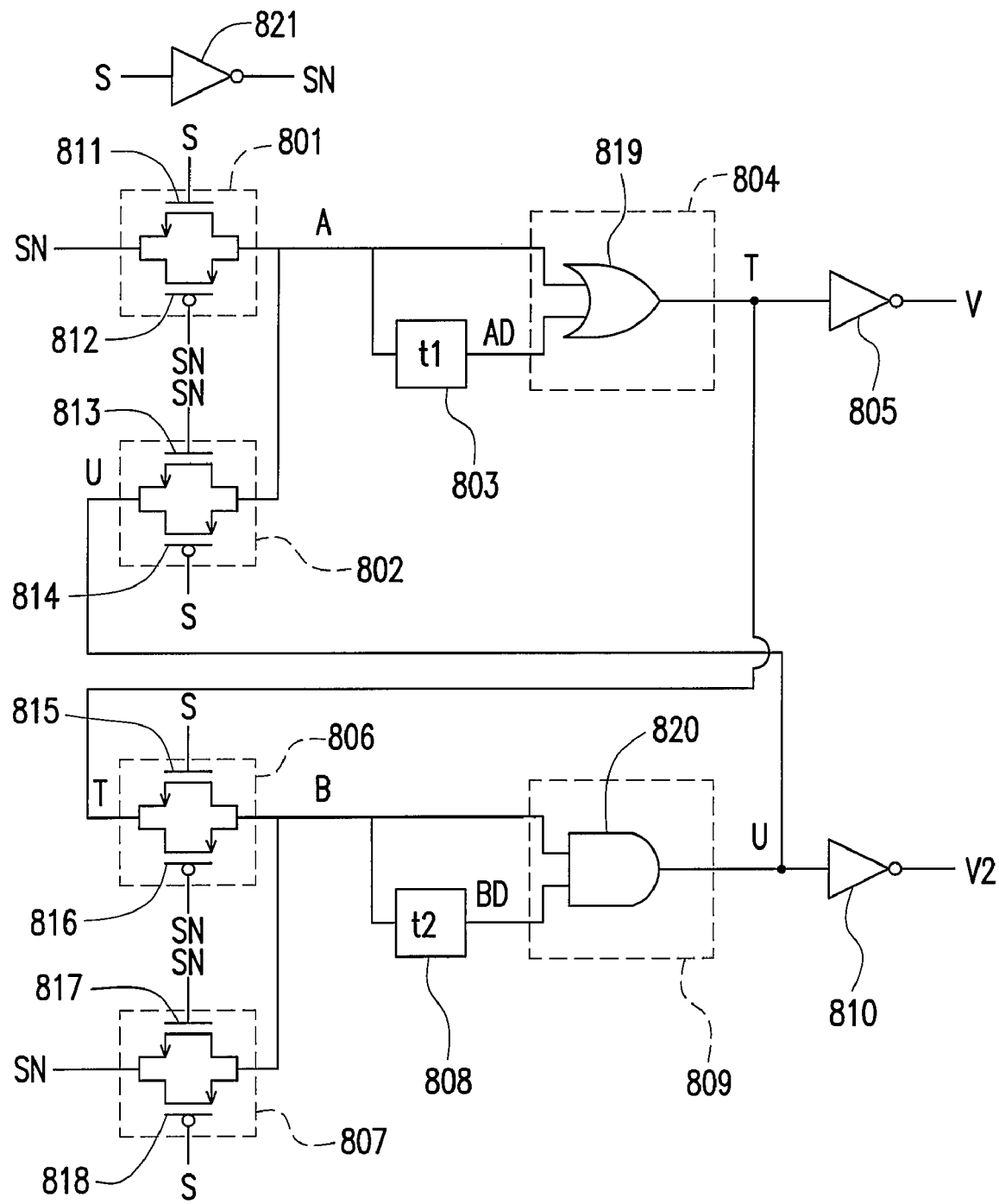
FIG. 8 is a circuit diagram of a glitch suppressing apparatus according to an embodiment of the present invention.

FIG. 8 is a circuit diagram of a glitch suppressing apparatus according to an embodiment of the present invention. Referring to FIG. 8, the glitch suppressing apparatus includes switches 801, 802, 806, and 807, and delay circuits 803 and 808, logic circuits 804 and 809 and inverters 805 and 810.

The switch 801 receives an input signal S and an input signal SN, and accordingly determines whether or not to output the input signal SN, wherein the input signal SN is an inverted signal of the input signal S. The switch 802 receives the input signal S, the input signal SN, and a logic signal U, and determines whether or not to output the logic signal U according to the input signal S and the input signal SN, wherein the outputs of the switches 801 and 802 form a signal A, which is one of the input signal SN and the logic signal U. The delay circuit 803 receives the signal A and delays the negative edge of the signal A to generate a delay signal AD. The logic circuit 804 receives the signal A and the delay signal AD to generate a logic signal T. The inverter 805 receives and inverts the logic signal T to generate an output signal V.

The switch 806 receives the input signal S, the input signal SN, and the logic signal T, and determines whether or not to output the logic signal T according to the input signal S and the input signal SN. The switch 807 receives the input signal S and the input signal SN, and accordingly determines whether or not to output the input signal SN, wherein the outputs of the switches 806 and 807 form a signal B, which is one of the input signal SN and the logic signal T. The delay circuit 808 receives the signal B and delays the positive edge of the delay signal B to generate a delay signal BD. The logic circuit 809 receives the signal B and the delay signal BD to generate the logic signal U. The inverter 810 receives and inverts the logic signal U, so as to generate an output signal V2.

In this embodiment, the switch 801 is implemented by an N-type metal oxide semiconductor field effect transistor 811 and a P-type metal oxide semiconductor field effect transistor 812. A gate of the transistor 811 receives the input signal S, and a source of the transistor 811 receives the input signal SN. A gate of the transistor 812 receives the input signal SN, a drain of the transistor 812 is coupled to the source of the transistor 811, and a source of the transistor 812 is coupled to the drain of the transistor 811, the delay circuit 803 and the logic circuit 804.

The switch 802 is implemented by an N-type metal oxide semiconductor field effect transistor 813 and a P-type metal oxide semiconductor field effect transistor 814. A gate of the transistor 813 receives the input signal SN, and a source of the transistor 813 receives the logic signal U. A gate of the transistor 814 receives the input signal S, a drain of the transistor 814 is coupled to the source of the transistor 813, and a source of the transistor 814 is coupled to the drain of the transistor 813 and the source of the transistor 812, so as to generate the signal A.

The switch 806 is implemented by an N-type metal oxide semiconductor field effect transistor 815 and a P-type metal oxide semiconductor field effect transistor 816. A gate of the transistor 815 receives the input signal S, and a source of the transistor 815 receives the logic signal T. A gate of the transistor 816 receives the input signal SN, a drain of the transistor 816 is coupled to the source of the transistor 815, and a source of the transistor 816 is coupled to the drain of the transistor 815, the delay circuit 808 and the logic circuit 809.

The switch 807 is implemented by an N-type metal oxide semiconductor field effect transistor 817 and a P-type metal oxide semiconductor field effect transistor 818. A gate of the transistor 817 receives the input signal SN, and a source of the transistor 817 receives the input signal SN. A gate of the transistor 818 receives the input signal S, a drain of the transistor 818 is coupled to the source of the transistor 817, and a source of the transistor 818 is coupled to the drain of the transistor 817 and the source of the transistor 816, so as to generate the signal B. It should be noted that, since metal oxide semiconductor field effect transistors are usually used as symmetrical components, the sources and drains may be exchanged, without influencing the property of the components.

As for the logic circuit, the logic circuits 804 and 809 are respectively implemented by an OR gate 819 and an AND gate 820. The two input terminals of the OR gate 819 receive the signal A and the delay signal AD respectively to generate the logic signal T. The two input terminals of the AND gate 820 receive the signal B and the delay signal BD respectively to generate the logic signal U. Under such a connecting architecture, the output signal V and the output signal V2 are the same. Additionally, a user inverts the input signal S into another input signal SN through an inverter 821.

Figure 9:
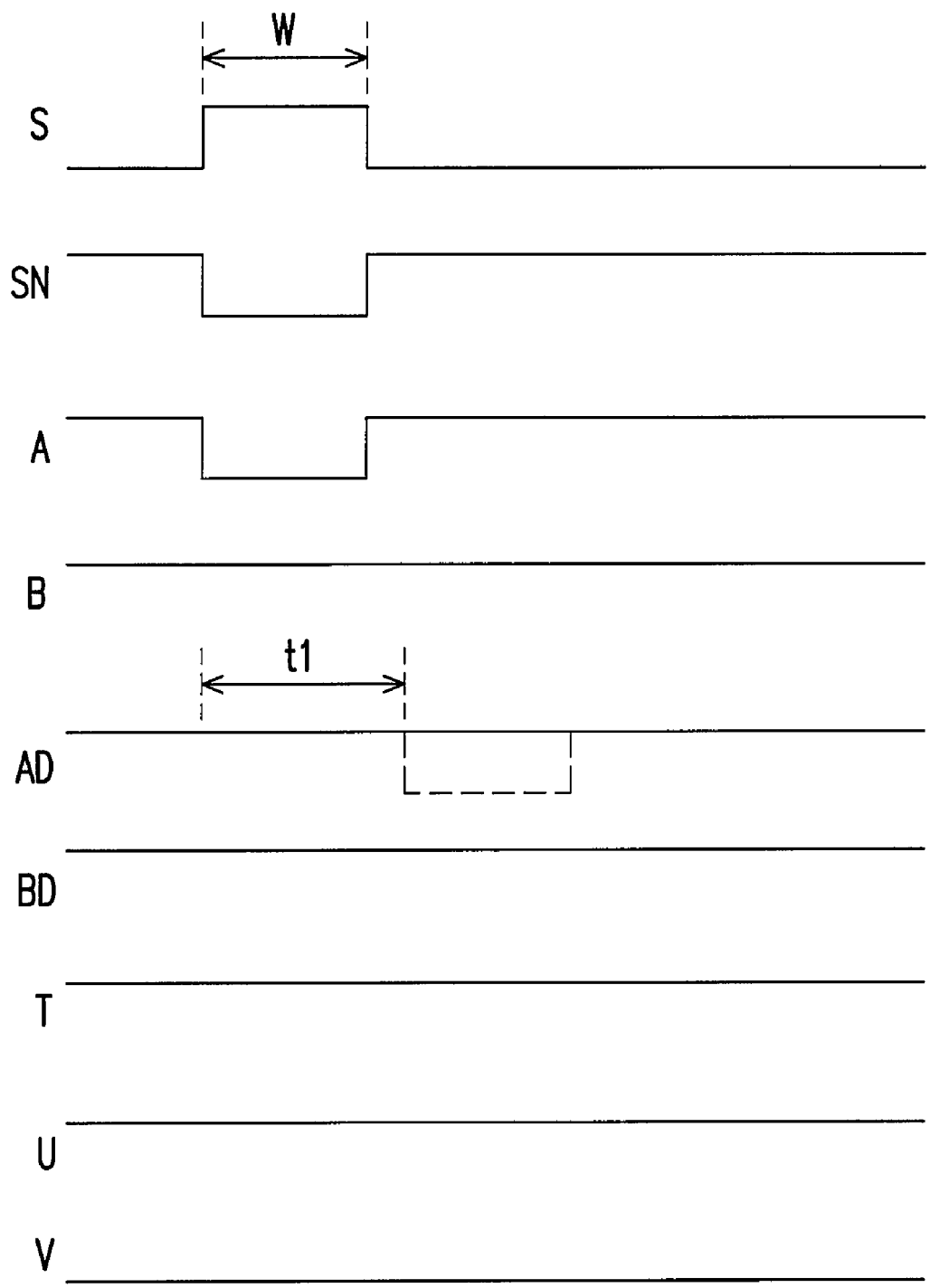
FIG. 9 shows the timings of each of the signals when the delay time t1 of the circuit shown in FIG. 8 is larger than the width W of the glitch.
Figure 10:
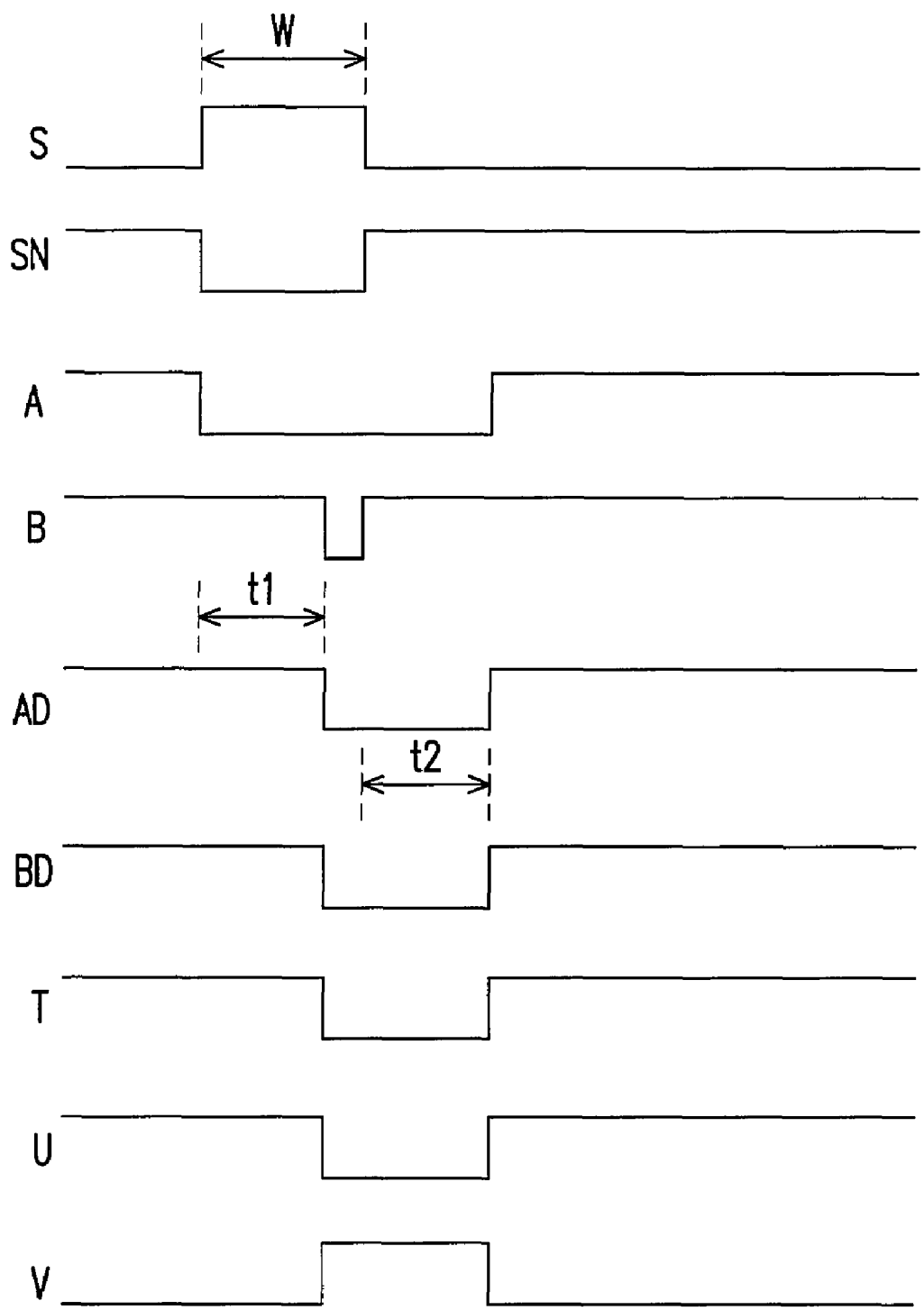
FIG. 10 shows the timings of each of the signals when the delay time t1 of the circuit shown in FIG. 8 is smaller than or equal to the width W of the glitch.

Provided that the input signal S has a positive glitch with a width W, the timings of each of the signals in the glitch suppressing apparatus are shown in FIGS. 9 and 10.

FIG. 9 shows the timings of each of the signals when the delay time t1 of the circuit shown in FIG. 8 is larger than the width W of the glitch. FIG. 10 shows the timings of each of the signals when the delay time t1 of the circuit shown in FIG. 8 is smaller than or equal to the width W of the glitch. It should be noted that, since the delay time t1 of the signal AD in FIG. 9 is larger than the width W of the glitch, the waveform of the signal AD is maintained at a high logic level (i.e., logic 1). As can be seen from FIG. 9 and FIG. 10, when the delay time t1 is larger than the width W of the glitch, the glitch suppressing apparatus filters the positive glitches in the input signal S, therefore, the output signal V without any positive glitches is obtained. However, under the circumstance that the delay time t1 is smaller than or equal to the width W of the glitch, the glitch suppressing apparatus cannot efficiently filter the positive glitches in the input signal S, as a result, the output signal V still has positive glitch noises.

Figure 11:
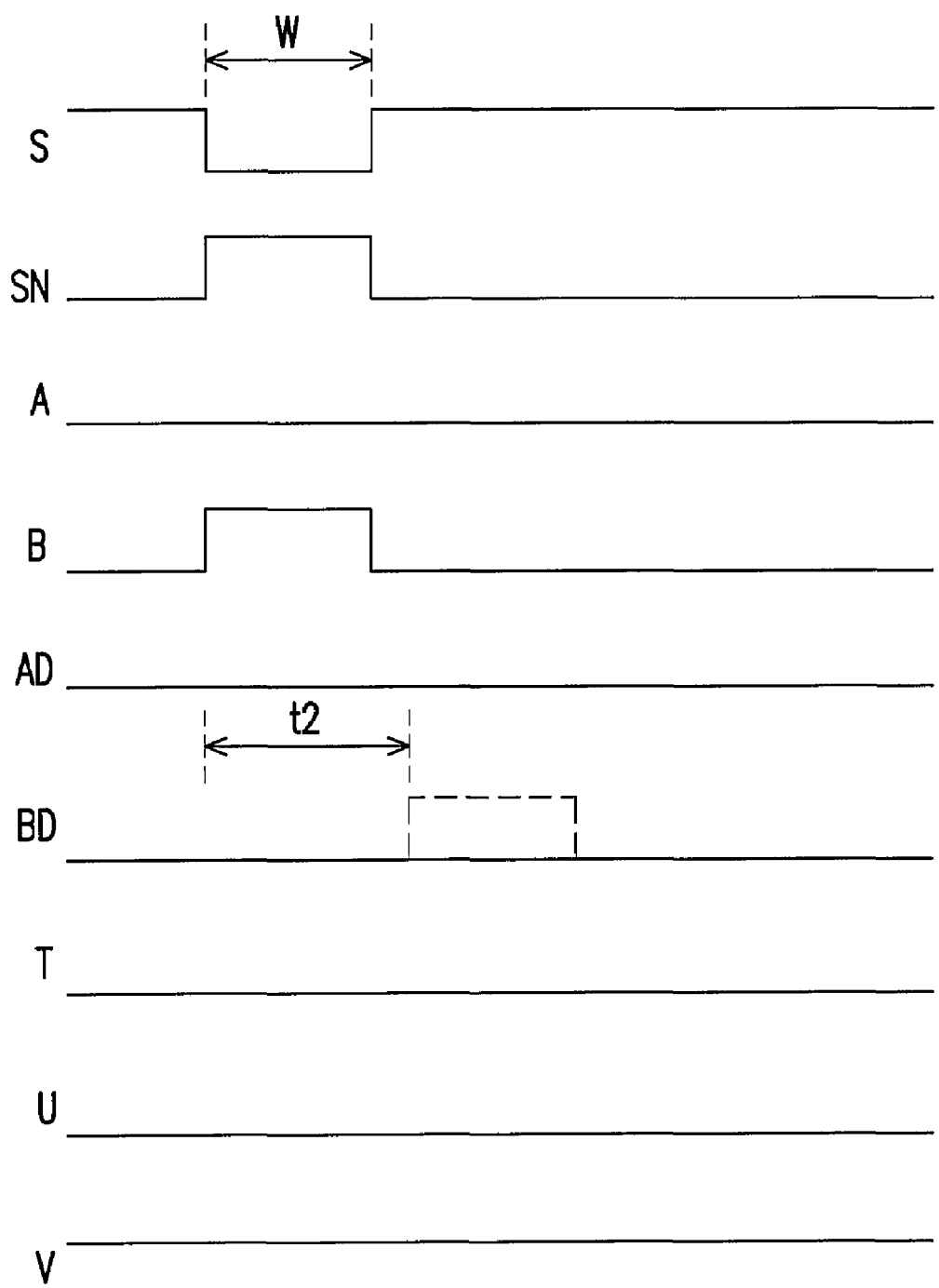
FIG. 11 shows the timings of each of the signals when the delay time t2 of the circuit shown in FIG. 8 is larger than the width W of the glitch.
Figure 12:
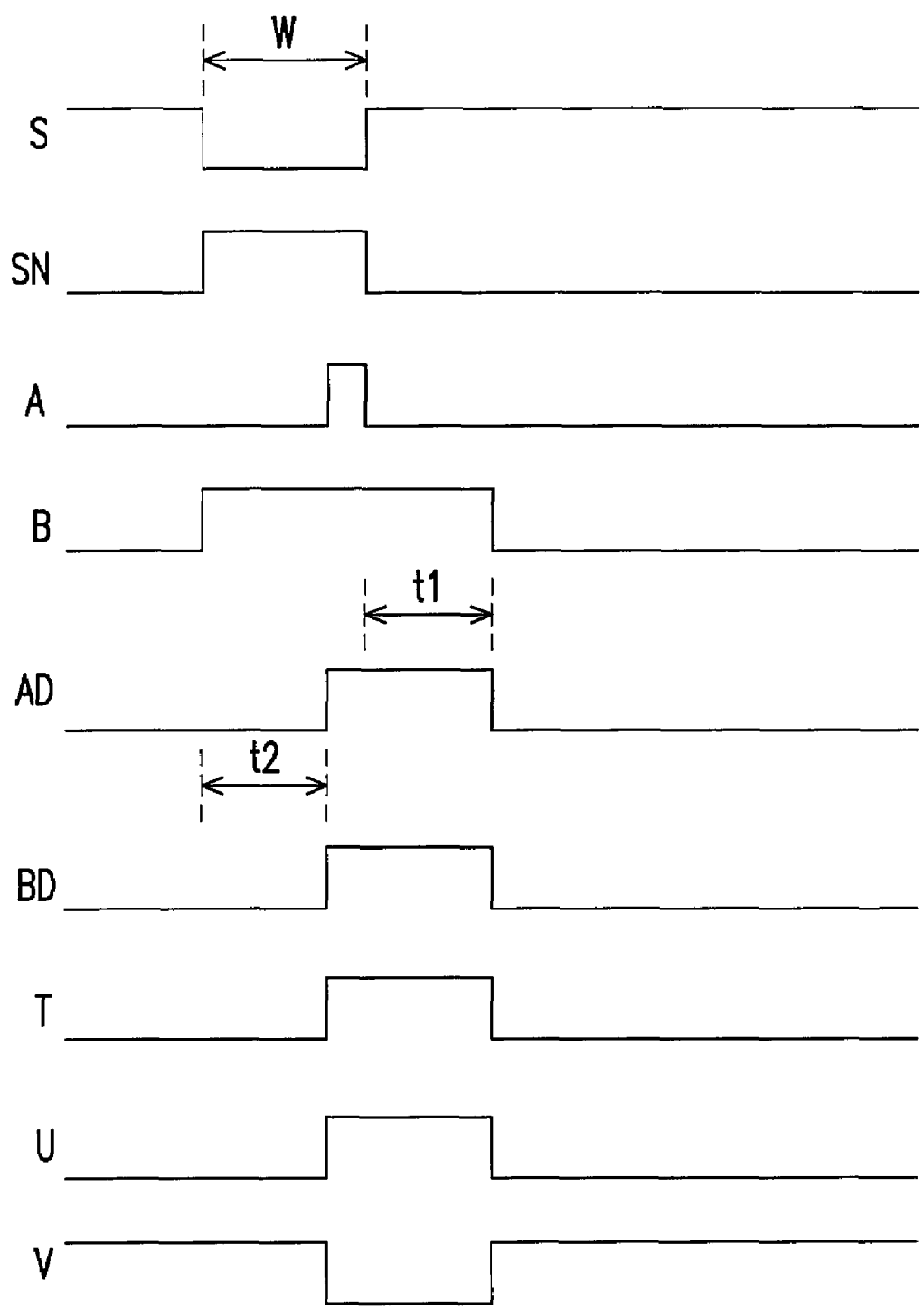
FIG. 12 shows the timings of each of the signals when the delay time t2 of the circuit shown in FIG. 8 is smaller than or equal to the width W of the glitch.

Provided that the input signal S has a negative glitch with a width W, the timings of each of the signals in the glitch suppressing apparatus are shown in FIGS. 11 and 12.

FIG. 11 shows the timings of each of the signals when the delay time t2 of the circuit shown in FIG. 8 is larger than the width W of the glitch. FIG. 12 shows the timings of each of the signals when the delay time t2 of the circuit shown in FIG. 8 is smaller than or equal to the width W of the glitch. It should be noted that, since the delay time t2 of the signal BD in FIG. 11 is larger than the width W of the glitch, the waveform of the signal BD is maintained at a low logic level (i.e., logic 0). As can be seen from FIG. 11 and FIG. 12, when the delay time t2 is larger than the width W of the glitch, the glitch suppressing apparatus filters the negative glitches in the input signal S, therefore, the output signal V without any negative glitches is obtained. However, under the circumstance that the delay time t2 is smaller than or equal to the width W of the glitch, the glitch suppressing apparatus cannot efficiently filter the negative glitches in the input signal S, as a result, the output signal V still has negative glitch noises.

Based upon the aforementioned embodiment, the glitch suppressing apparatus may use the specific connection relations and functions of the above components to filter positive glitches and negative glitches in the same circuit, thereby reducing the occupied chip area. Furthermore, the limit of the glitch suppressing apparatus in filtering noises may be improved simply through suitably adjusting the delay time. However, besides the implementation method mentioned in the aforementioned embodiment, different manufacturers have different designs of the logic circuits, thus, one of other possible implementation methods will be illustrated below, as shown in FIG. 13.

Figure 13:
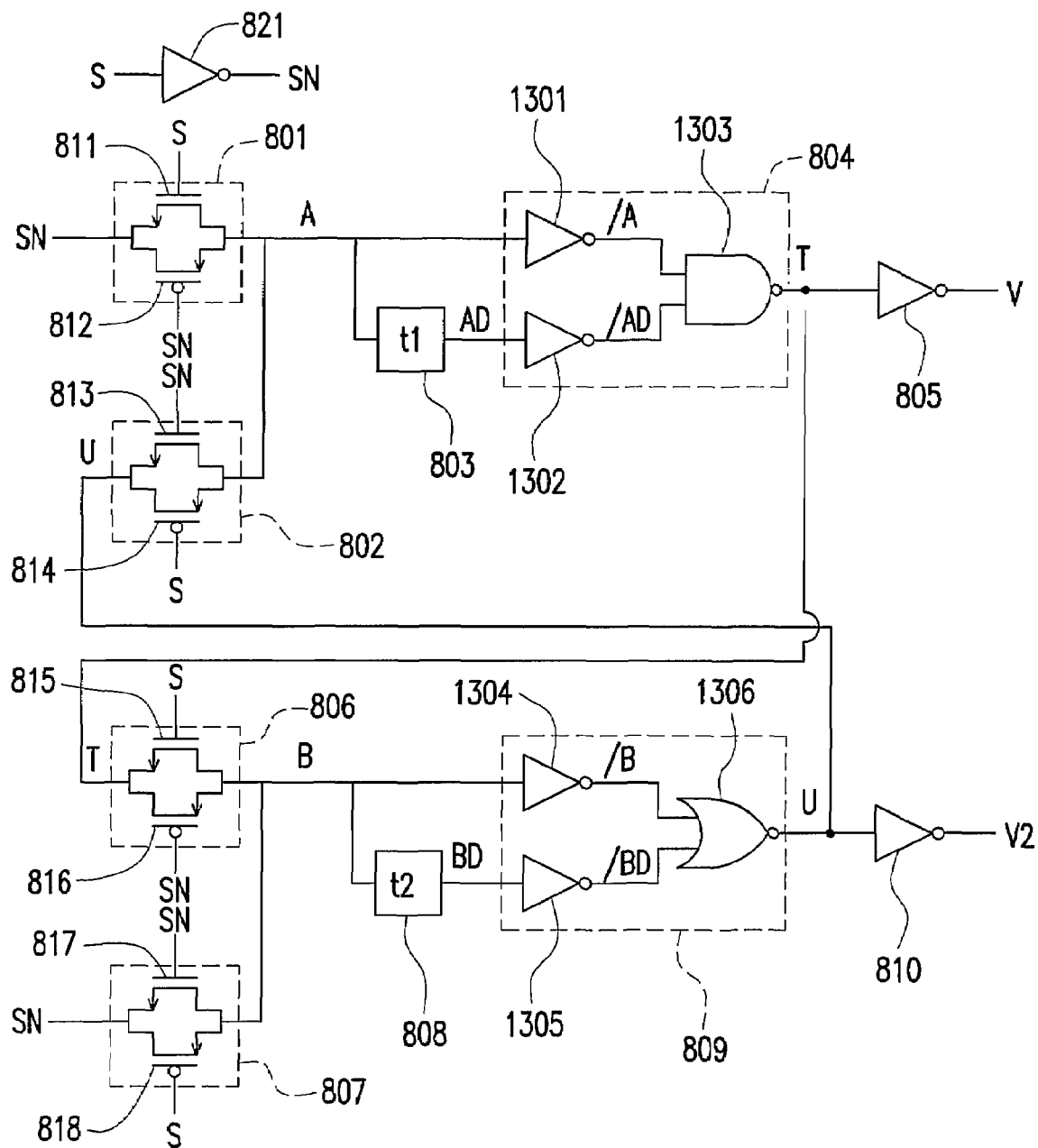
FIG. 13 is a circuit diagram of a glitch suppressing apparatus according to another embodiment of the present invention.

FIG. 13 is a circuit diagram of a glitch suppressing apparatus according to another embodiment of the present invention. Referring to FIG. 13, the circuits in FIGS. 13 and 8 are substantially the same, and the only difference lies in that, the circuit in FIG. 13 uses inverters 1301 and 1302 and a NAND gate 1303 to replace the OR gate 819 in FIG. 8, and uses inverters 1304 and 1305 and an NOR gate 1306 to replace the AND gate 820 in FIG. 8.

The inverter 1301 is used to receive and invert the signal A. The inverter 1302 is used to receive and invert the delay signal AD. The two input terminals of the NAND gate 1303 receive the outputs of the inverters 1301 and 1302 respectively, so as to generate the logic signal T. The inverter 1304 is used to receive and invert the signal B. The inverter 1305 is used to receive and invert the delay signal BD. The two input terminals of the NOR gate 1306 receive the outputs of the inverters 1304 and 1035 respectively to generate the logic signal U.

Figure 14:
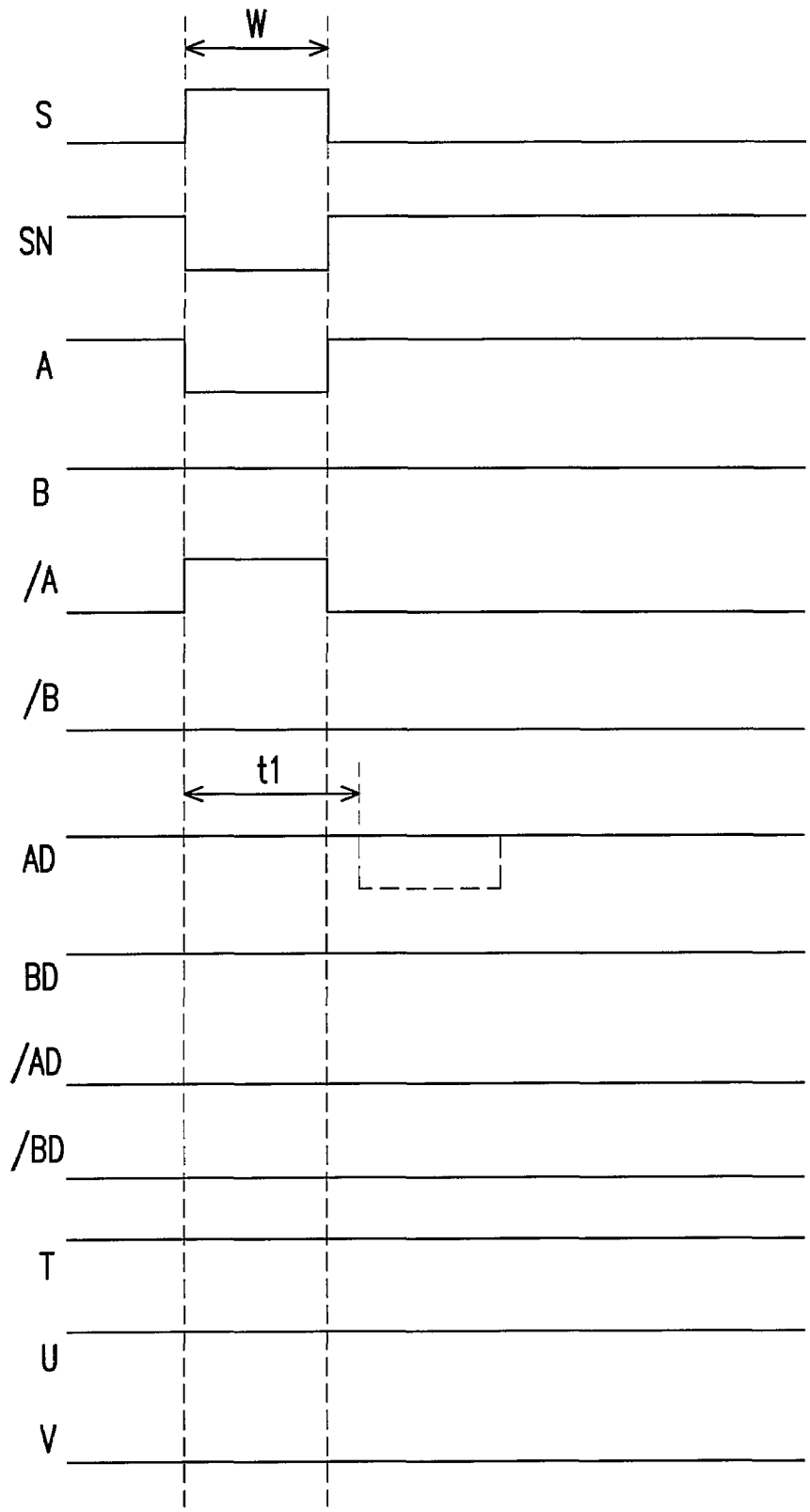
FIG. 14 shows the timings of each of the signals when the delay time t1 of the circuit shown in FIG. 13 is larger than the width W of the glitch.
Figure 15:
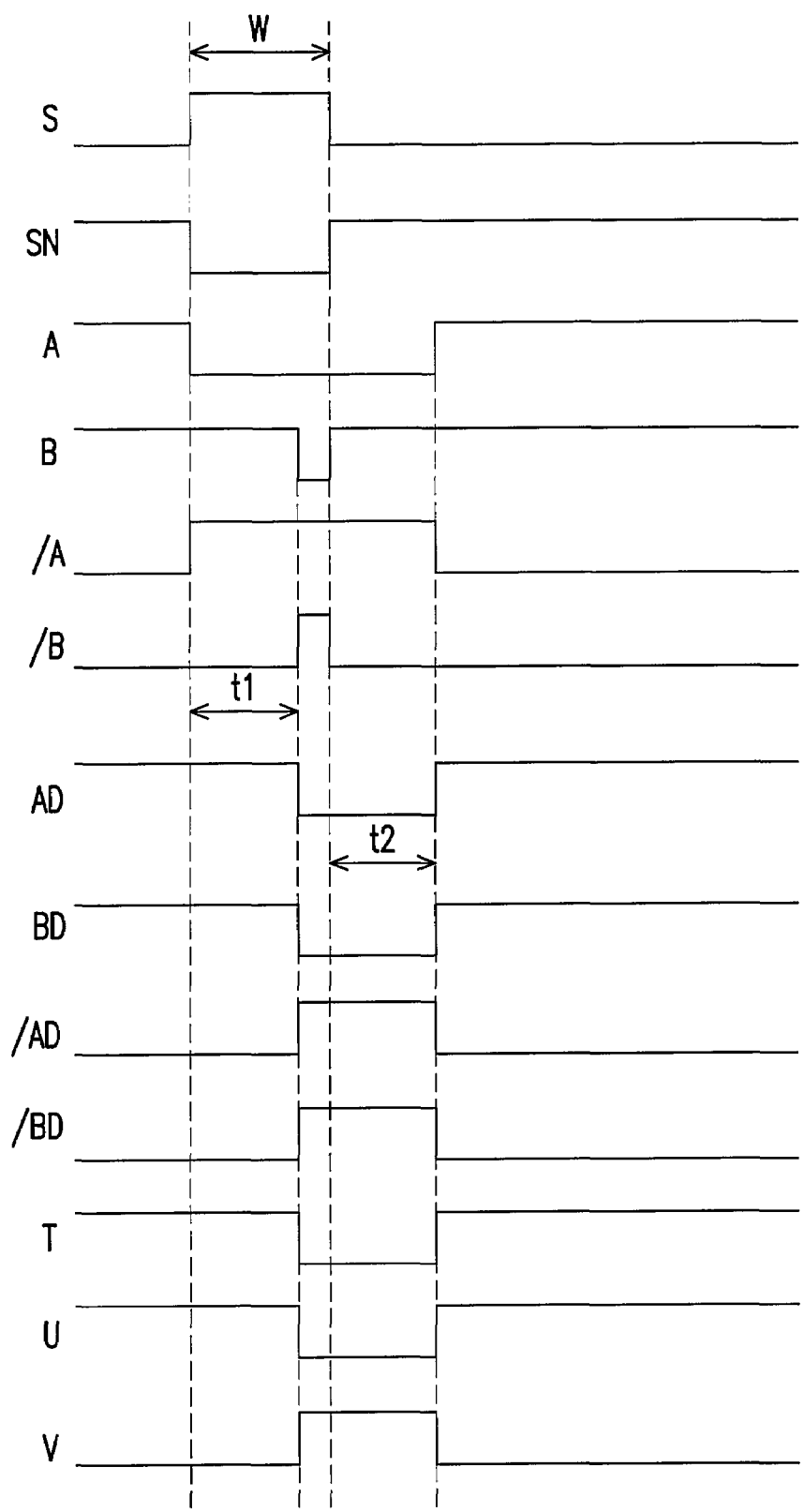
FIG. 15 shows the timings of each of the signals when the delay time t1 of the circuit shown in FIG. 13 is smaller than or equal to the width W of the glitch.

Provided that the input signal S has a positive glitch with a width W, the timings of each of the signals in the glitch suppressing apparatus are shown in FIGS. 14 and 15.

FIG. 14 shows the timings of each of the signals when the delay time t1 of the circuit shown in FIG. 13 is larger than the width W of the glitch. FIG. 15 shows the timings of each of the signals when the delay time t1 of the circuit shown in FIG. 13 is smaller than or equal to the width W of the glitch. It should be noted that, since the delay time t1 of the signal AD in FIG. 14 is larger than the width W of the glitch, the waveform of the signal AD is maintained at a high logic level (i.e., logic 1). As can be seen from FIG. 14 and FIG. 15, when the delay time t1 is larger than the width W of the glitch, the glitch suppressing apparatus filters the positive glitches in the input signal S, therefore, the output signal V without any positive glitches is obtained. However, under the circumstance that the delay time t1 is smaller than or equal to the width W of the glitch, the glitch suppressing apparatus cannot efficiently filter the positive glitches in the input signal S, as a result, the output signal V still has positive glitch noises.

Figure 16:
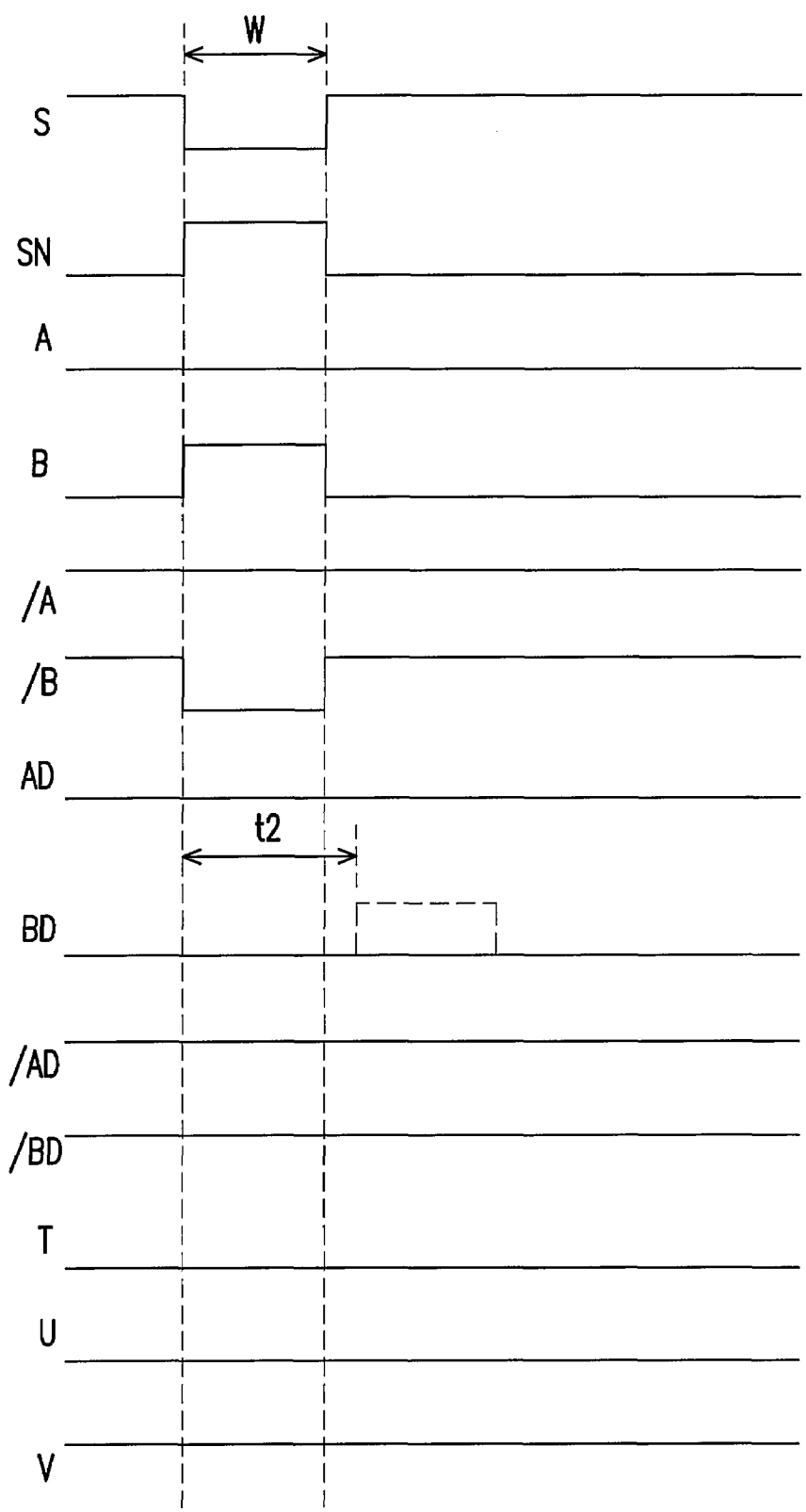
FIG. 16 shows the timings of each of the signals when the delay time t2 of the circuit shown in FIG. 13 is larger than the width W of the glitch.
Figure 17:
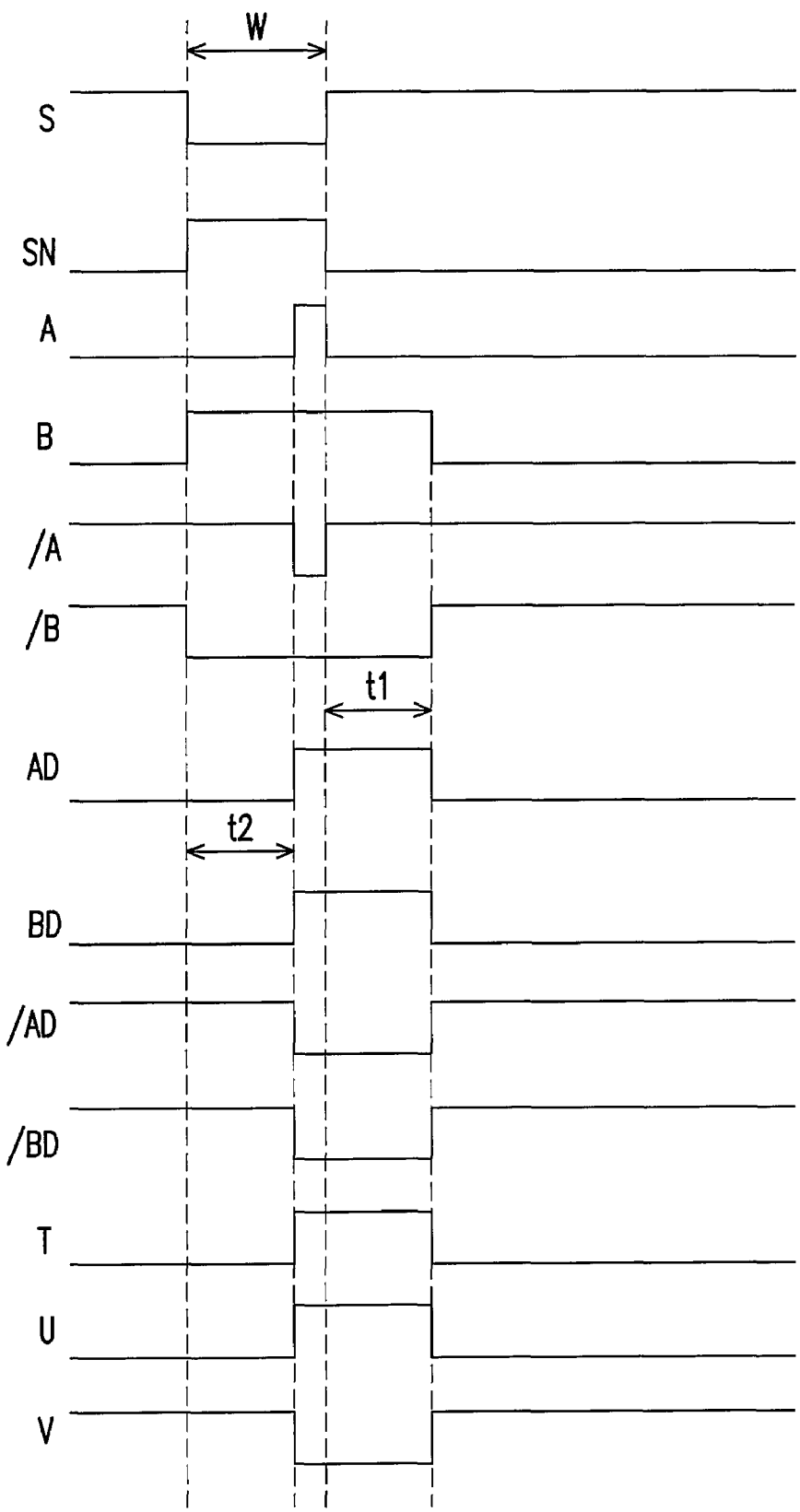
FIG. 17 shows the timings of each of the signals when the delay time t2 of the circuit shown in FIG. 13 is smaller than or equal to the width W of the glitch.

Provided that the input signal S has a negative glitch with a width W, the timings of each of the signals in the glitch suppressing apparatus are shown in FIGS. 16 and 17.

FIG. 16 shows the timings of each of the signals when the delay time t2 of the circuit shown in FIG. 13 is larger than the width W of the glitch. FIG. 17 shows the timings of each of the signals when the delay time t2 of the circuit shown in FIG. 13 is smaller than or equal to the width W of the glitch. It should be noted that, since the delay time t2 of the signal BD in FIG. 16 is larger than the width W of the glitch, the waveform of the signal BD is maintained at a low logic level (i.e., logic 0). As can be seen from FIG. 16 and FIG. 17, when the delay time t2 is larger than the width W of the glitch, the glitch suppressing apparatus filters the negative glitches in the input signal S, therefore, the output signal V without any negative glitches is obtained. However, under the circumstance that the delay time t2 is smaller than or equal to the width W of the glitch, the glitch suppressing apparatus cannot efficiently filter the negative glitches in the input signal S, as a result, the output signal V still has negative glitch noises.

Figure 18:
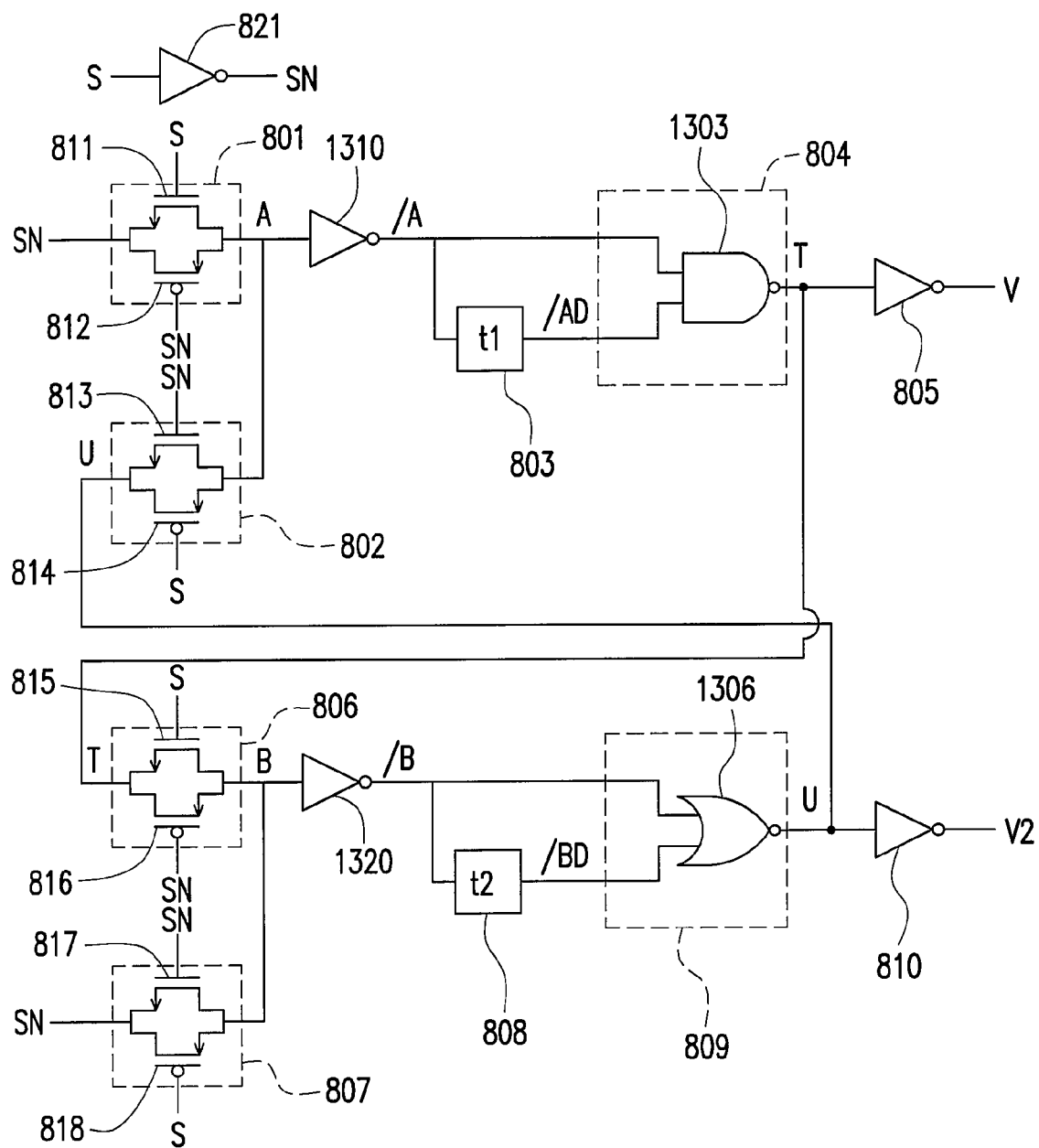
FIG. 18 is a circuit diagram of a glitch suppressing apparatus according to still another embodiment of the present invention.

Those skilled in the art may modify the circuit in FIG. 13, as shown in FIG. 18. FIG. 18 is a circuit diagram of a glitch suppressing apparatus according to still another embodiment of the present invention. Referring to FIG. 18, the difference between FIGS. 18 and 13 lies in that, both of the logic circuits 804 and 809 in FIG. 18 do not employ any inverters. Once the signal A is generated, it is immediately inverted into an inverted signal /A through the inverter 1310. Then, the inverted signal /A is input to the delay circuit 803 and an input terminal of the NAND gate 1303. Furthermore, once the signal B is generated, it is inverted into an inverted signal /B through the inverter 1320. Finally, the inverted signal /B is input to the delay circuit 808 and an input terminal of the NOR gate 1306. However, it should be noted that, the delay circuit 803 must be changed to delay the positive edge of the input signal, and the delay circuit 808 must be changed to delay the negative edge of the input signal to obtain the logic signals T and U, which are the same as that obtained in the circuit in FIG. 13.

To sum up, the glitch suppressing apparatus of the present invention includes four N-type transistors, four P-type transistors, the first delay circuit, the second delay circuit, the first logic circuit, the second logic circuit and two inverters, such that the glitch suppressing apparatus uses the specific connection relations and functions of the above components to filter positive glitches and negative glitches in the same circuit, thereby reducing the chip area occupation.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A glitch suppressing apparatus, comprising:
   a first switch, for receiving a first input signal and a second input signal, for determining whether or not to output the second input signal according to the first and second input signals, wherein the second input signal is an inverted signal of the first input signal;
   a second switch, for receiving the first input signal, the second input signal and a first logic signal, for determining whether or not to output the first logic signal according to the first input signal and the second input signal, wherein outputs of the first switch and the second switch form a first signal;
   a first delay circuit, for receiving the first signal and delaying the negative edge of the first signal to generate a first delay signal;
   a first logic circuit, for receiving the first signal and the first delay signal to generate a second logic signal;
   a first inverter, for receiving and inverting the second logic signal to generate a first output signal;
   a third switch, for receiving the first input signal, the second input signal and the second logic signal, for determining whether or not to output the second logic signal according to the first input signal and the second input signal;
   a fourth switch, for receiving the first input signal and the second input signal, for determining whether or not to output the second input signal, wherein the outputs of the third switch and the fourth switch form a second signal;
   a second delay circuit, for receiving the second signal and delaying the positive edge of the second signal to generate a second delay signal;
   a second logic circuit, for receiving the second signal and the second delay signal to generate the first logic signal; and
   a second inverter, for receiving and inverting the first logic signal to generate a second output signal.

2. The glitch suppressing apparatus as claimed in claim 1, wherein the first signal is one of the second input signal and the first logic signal, and the second signal is one of the second input signal and the second logic signal.

3. The glitch suppressing apparatus as claimed in claim 1, wherein the first switch comprises:
   a first transistor, comprising a first gate for receiving the first input signal, and a source/drain for receiving the second input signal; and
   a second transistor, comprising a second gate, a source/drain for receiving the second input signal and another source/drain coupled to another source/drain of the first transistor, the first logic circuit and the first delay circuit.

4. The glitch suppressing apparatus as claimed in claim 3, wherein the second switch comprises:
   a third transistor, comprising a third gate for receiving the second input signal and a source/drain for receiving the first logic signal; and
   a fourth transistor, comprising a fourth gate for receiving the first input signal, a source/drain for receiving the first logic signal and another source/drain coupled to another source/drain of the third transistor and the another source/drain of the second transistor to generate the first signal.

5. The glitch suppressing apparatus as claimed in claim 4, wherein the third switch comprises:
- a fifth transistor, comprising a fifth gate for receiving the first input signal and a source/drain for receiving the second logic signal; and
- a sixth transistor, comprising a sixth gate for receiving the second input signal a source/drain for receiving the second logic signal and another source/drain coupled to the another source/drain of the fifth transistor, the second logic circuit and the second delay circuit.

6. The glitch suppressing apparatus as claimed in claim 5, wherein the fourth switch comprises:
- a seventh transistor, comprising a seventh gate and a source/drain for receiving the second input signal; and
- an eighth transistor, comprising an eighth gate for receiving the first input signal, a source/drain for receiving the second input signal and another source/drain coupled to the another source/drain of the seventh transistor and the another source/drain of the sixth transistor to generate the second signal.

7. The glitch suppressing apparatus as claimed in claim 6, wherein the first transistor, the third transistor, the fifth transistor, and the seventh transistor comprise N-type metal oxide semiconductor field effect transistors; and the second transistor, the fourth transistor, the sixth transistor, and the eighth transistor comprise P-type metal oxide semiconductor field effect transistors.

8. The glitch suppressing apparatus as claimed in claim 1, wherein the first logic circuit comprises:
- an OR gate, comprising two input terminals for receiving the first signal and the first delay signal respectively to generate the second logic signal.

9. The glitch suppressing apparatus as claimed in claim 1, wherein the first logic circuit comprises:
- a third inverter, for receiving and inverting the first signal;
- a fourth inverter, for receiving and inverting the first delay signal; and
- a NAND gate, comprising two input terminals for receiving outputs of the third inverter and the fourth inverter respectively to generate the second logic signal.

10. The glitch suppressing apparatus as claimed in claim 1, wherein the second logic circuit comprises:
- an AND gate, comprising two input terminals for receiving the second signal and the second delay signal respectively to generate the first logic signal.

11. The glitch suppressing apparatus as claimed in claim 1, wherein the second logic circuit comprises:
- a fifth inverter, for receiving and inverting the second signal;
- a sixth inverter, for receiving and inverting the second delay signal; and
- a NOR gate, comprising two input terminals for receiving outputs of the fifth inverter and the sixth inverter respectively to generate the first logic signal.

12. The glitch suppressing apparatus as claimed in claim 1, further comprising an inverter for receiving and inverting the first input signal into the second input signal.

13. A glitch suppressing apparatus, comprising:
- a first switch, for receiving a first input signal and a second input signal and determining whether or not to output the second input signal according to the first input signal and the second input signal, wherein the second input signal is an inverted signal of the first input signal;
- a second switch, for receiving the first input signal, the second input signal and a first logic signal, and determining whether or not to output the first logic signal according to the first input signal and the second input signal, wherein the outputs of the first switch and the second switch form a first signal;
- a first inverter, comprising an input terminal for receiving the first signal to generate an inverted signal of the first signal;
- a first delay circuit, for receiving the inverted signal of the first signal and delaying the positive edge of the inverted signal of the first signal to generate a first delay signal;
- a first logic circuit, for receiving the inverted signal of the first signal and the first delay signal to generate a second logic signal;
- a second inverter, for receiving and inverting the second logic signal to generate a first output signal;
- a third switch, for receiving the first input signal, the second input signal and the second logic signal, and determining whether or not to output the second logic signal according to the first input signal and the second input signal;
- a fourth switch, for receiving the first input signal and the second input signal, and determining whether or not to output the second input signal according to the first input signal and the second input signal, wherein the outputs of the third switch and the fourth switch form a second signal;
- a third inverter, comprising an input terminal for receiving the second signal to generate an inverted signal of the second signal;
- a second delay circuit, for receiving the inverted signal of the second signal and delaying the negative edge of the inverted signal of the second signal to generate a second delay signal;
- a second logic circuit, for receiving the inverted signal of the second signal and the second delay signal to generate the first logic signal; and
- a fourth inverter, for receiving and inverting the first logic signal to generate a second output signal.

14. The glitch suppressing apparatus as claimed in claim 13, wherein the first signal comprises the second input signal or the first logic signal, and the second signal comprises the second input signal or the second logic signal.

15. The glitch suppressing apparatus as claimed in claim 13, wherein the first switch comprises:
- a first transistor, comprising a first gate for receiving the first input signal and a source/drain for receiving the second input signal; and
- a second transistor, comprising a second gate and a source/drain for receiving the second input signal and another source/drain coupled to another source/drain of the first transistor and the input terminal of the first inverter.

16. The glitch suppressing apparatus as claimed in claim 15, wherein the second switch comprises:
- a third transistor, comprising a third gate for receiving the second input signal and a source/drain for receiving the first logic signal; and
- a fourth transistor, comprising a fourth gate for receiving the first input signal, a source/drain for receiving the first logic signal and another source/drain coupled to the another source/drain of the third transistor and the another source/drain of the second transistor to generate the first signal.

17. The glitch suppressing apparatus as claimed in claim 16, wherein the third switch comprises:

a fifth transistor, comprising a fifth gate for receiving the first input signal and a source/drain for receiving the second logic signal; and a sixth transistor, comprising a sixth gate for receiving the second input signal, a source/drain for receiving the second logic signal and another source/drain coupled to another source/drain of the fifth transistor and the input terminal of the third inverter.

18. The glitch suppressing apparatus as claimed in claim 17, wherein the fourth switch comprises:

a seventh transistor, comprising a seventh gate and a source/drain for receiving the second input signal; and an eighth transistor, comprising an eighth gate for receiving the first input signal, a source/drain for receiving the second input signal and another source/drain coupled to another source/drain of the seventh transistor and the another source/drain of the sixth transistor to generate the second signal.

19. The glitch suppressing apparatus as claimed in claim 18, wherein the first transistor, the third transistor, the fifth transistor, and the seventh transistor comprise N-type metal oxide semiconductor field effect transistors; and the second transistor, the fourth transistor, the sixth transistor, and the eighth transistor comprise P-type metal oxide semiconductor field effect transistors.

20. The glitch suppressing apparatus as claimed in claim 13, wherein the first logic circuit comprises:

a NAND gate, comprising two input terminals for receiving the inverted signal of the first signal and the first delay signal respectively to generate the second logic signal.

21. The glitch suppressing apparatus as claimed in claim 13, wherein the second logic circuit comprises:

a NOR gate, comprising two input terminals for receiving the inverted signal of the second signal and the second delay signal respectively to generate the first logic signal.

22. The glitch suppressing apparatus as claimed in claim 13, further comprising a fifth inverter for receiving and inverting the first input signal into the second input signal.

* * * * *